United States Patent
Gueta et al.

(10) Patent No.: US 9,612,904 B2
(45) Date of Patent: Apr. 4, 2017

(54) MEMORY SYSTEM AND METHOD FOR SECURING VOLATILE MEMORY DURING SLEEP MODE USING THE SAME ECC MODULE USED TO SECURE NON-VOLATILE MEMORY DURING ACTIVE MODE

(71) Applicant: SanDisk Technologies Inc., Plano, TX (US)

(72) Inventors: Asaf Gueta, Or-Yehuda (IL); Arseniy Aharonov, Tzur Yitzhak (IL); Inon Cohen, Oranit (IL); Rotem Bahar, Tel Aviv (IL); Oran DeBotton, Kfar Saba (IL); Tzachy Yizhaki, Kfar Saba (IL); Itshak Afriat, Sunnyvale, CA (US)

(73) Assignee: SanDisk Technologies LLC, Plano, TX (US)

( * ) Notice: Subject to any disclaimer, the term of this patent is extended or adjusted under 35 U.S.C. 154(b) by 43 days.

(21) Appl. No.: 14/698,530

(22) Filed: Apr. 28, 2015

(65) Prior Publication Data

US 2016/0224418 A1 Aug. 4, 2016

Related U.S. Application Data

(60) Provisional application No. 62/110,921, filed on Feb. 2, 2015.

(51) Int. Cl.
| | |
|---|---|
| *G11C 29/00* | (2006.01) |
| *G06F 11/10* | (2006.01) |
| *H03M 13/13* | (2006.01) |
| *G11C 29/52* | (2006.01) |
| *H03M 13/11* | (2006.01) |
| *G11C 29/04* | (2006.01) |

(52) U.S. Cl.
CPC ......... *G06F 11/1048* (2013.01); *H03M 13/13* (2013.01); *G11C 29/52* (2013.01); *G11C 2029/0411* (2013.01); *H03M 13/1102* (2013.01)

(58) Field of Classification Search
None
See application file for complete search history.

(56) References Cited

U.S. PATENT DOCUMENTS

| | | | |
|---|---|---|---|
| 4,506,362 A | 3/1985 | Morley | |
| 6,341,143 B1* | 1/2002 | Nelson | G06F 8/65 375/222 |
| 6,694,360 B1* | 2/2004 | Duguay | H04L 69/22 709/220 |
| 7,171,605 B2 | 1/2007 | White | |
| 7,428,687 B2* | 9/2008 | Klein | G11C 7/20 714/754 |
| 8,321,761 B1 | 11/2012 | Gruner et al. | |
| 2003/0058733 A1* | 3/2003 | Mori | G11C 16/10 365/238.5 |

(Continued)

*Primary Examiner* — Daniel McMahon
(74) *Attorney, Agent, or Firm* — Brinks Gilson & Lione

(57) ABSTRACT

In one embodiment, a memory system is provided comprising a volatile memory, a non-volatile memory, and an error correction code (ECC) module. The ECC module is configured to encode, decode, and correct data stored in the volatile memory when the memory system enters and exits a sleep mode and is further configured to encode, decode, and correct data stored in the non-volatile memory when the memory system is in an active mode.

30 Claims, 4 Drawing Sheets

(56) References Cited

U.S. PATENT DOCUMENTS

| | | |
|---|---|---|
| 2003/0149929 A1 | 8/2003 | White |
| 2007/0300010 A1* | 12/2007 | Yang .................. G06F 13/28 711/103 |
| 2008/0040531 A1* | 2/2008 | Anderson ......... G06F 11/1068 710/313 |
| 2008/0222483 A1* | 9/2008 | Ito ..................... G06F 11/106 714/754 |
| 2011/0314204 A1* | 12/2011 | Ootsuka ............ G06F 12/0246 711/103 |
| 2013/0104004 A1* | 4/2013 | Maeda ................ G06F 13/16 714/773 |

\* cited by examiner

MEMORY SYSTEM AND METHOD FOR SECURING VOLATILE MEMORY DURING SLEEP MODE USING THE SAME ECC MODULE USED TO SECURE NON-VOLATILE MEMORY DURING ACTIVE MODE

BACKGROUND

This application claims the benefit of U.S. provisional patent application no. 62/110,921, filed Feb. 2, 2015, which is hereby incorporated by reference.

BACKGROUND

Memory systems are often used in battery-powered mobile devices, such as smart phones and tablets. The battery of the mobile device powers both the memory system and other components of the mobile device (e.g., the display). In order to conserve power, the mobile device can enter a "sleep mode" (or deep power down (DPD)), in which power is reduced or removed from certain components in the mobile device. A memory system, such as an embedded multi-media card (e-MMC), often contains both non-volatile memory (e.g., NAND) for long-term data storage and volatile memory (e.g., registers and static random access memory (SRAM)) for temporary data storage. If the memory system is in sleep mode for a long period of time, the reduction in the power supply voltage to the volatile memory can cause bit flips (e.g., initially-stored 0s being read as 1s, or initially-stored 1s being read as 0s) at unpredictable locations in the volatile memory. These bit flips can be caused by alpha particle radiation and various circuit and process failures, such as weak cells, parasitic capacitances, cross couplings, and timing issues, for example. This can cause serious and unpredictable device failures. For example, program command bits may be erroneously flipped making the command unknown to the processor.

OVERVIEW

Embodiments of the present invention are defined by the claims, and nothing in this section should be taken as a limitation on those claims.

By way of introduction, the below embodiments relate to a memory system and method for securing volatile memory during sleep mode using the same ECC module used to secure non-volatile memory during active mode. In one embodiment, a memory system is provided comprising a volatile memory, a non-volatile memory, and an error correction code (ECC) module. The ECC module is configured to encode, decode, and correct data stored in the volatile memory when the memory system enters and exits a sleep mode and is further configured to encode, decode, and correct data stored in the non-volatile memory when the memory system is in an active mode. Other embodiments are possible, and each of the embodiments can be used alone or together in combination. Accordingly, various embodiments will now be described with reference to the attached drawings.

DETAILED DESCRIPTION OF THE PRESENTLY PREFERRED EMBODIMENTS

As mentioned in the background section above, if the memory system is in sleep mode for a long period of time, the reduction in the power supply voltage to the volatile memory can cause bit flips (e.g., initially-stored 0s being read as 1s, or initially-stored 1s being read as 0s) at unpredictable locations in volatile memory. This can cause serious and unpredictable device failures, such as when program command bits are erroneously flipped, making the command unknown to the processor. The following embodiments can be used to address this situation. In one embodiment, a memory system and method are provided for securing volatile memory during sleep mode using the same ECC module used to secure non-volatile memory during active mode. Before turning to these and other embodiments, the following paragraphs provide a discussion of exemplary memory systems that can be used with these embodiments. Of course, these are just examples, and other suitable types of memory systems can be used.

Figure 1A:
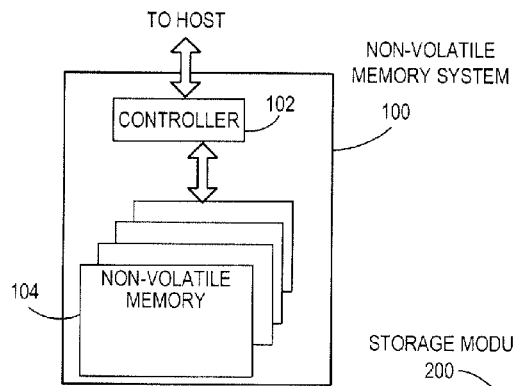
FIG. 1A is a block diagram of a non-volatile memory system of an embodiment.
Figure 1B:
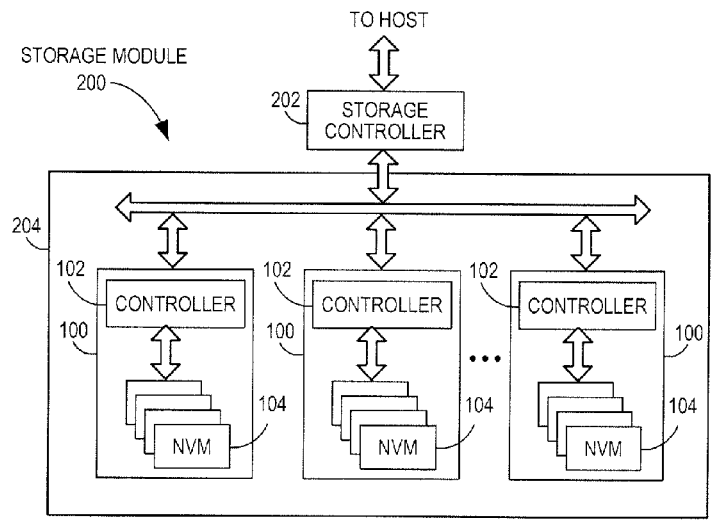
FIG. 1B is a block diagram illustrating an exemplary storage module of an embodiment.
Figure 1C:
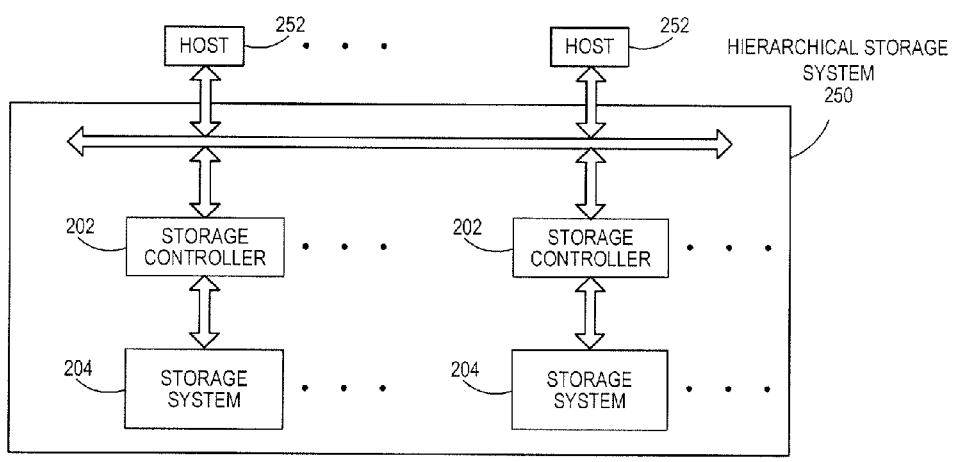
FIG. 1C is a block diagram illustrating a hierarchical storage system of an embodiment.

Memory systems suitable for use in implementing aspects of these embodiments are shown in FIGS. 1A-1C. FIG. 1A is a block diagram illustrating a non-volatile memory system according to an embodiment of the subject matter described herein. Referring to FIG. 1A, non-volatile memory system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system.

Although, in the example illustrated in FIG. 1A, non-volatile memory system 100 (sometimes referred to herein as a storage module) includes a single channel between controller 102 and non-volatile memory die 104, the subject matter described herein is not limited to having a single memory channel. For example, in some NAND memory system architectures (such as the ones shown in FIGS. 1B and 1C), 2, 4, 8 or more NAND channels may exist between the controller and the NAND memory device, depending on controller capabilities. In any of the embodiments described herein, more than a single channel may exist between the controller and the memory die, even if a single channel is shown in the drawings. For example, controllers can be used with multiple separated NAND channels (each of which can contain several (e.g., 2, 4, 8, etc.) NAND dies).

FIG. 1B illustrates a storage module 200 that includes plural non-volatile memory systems 100. As such, storage module 200 may include a storage controller 202 that interfaces with a host and with storage system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be an NVMe or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
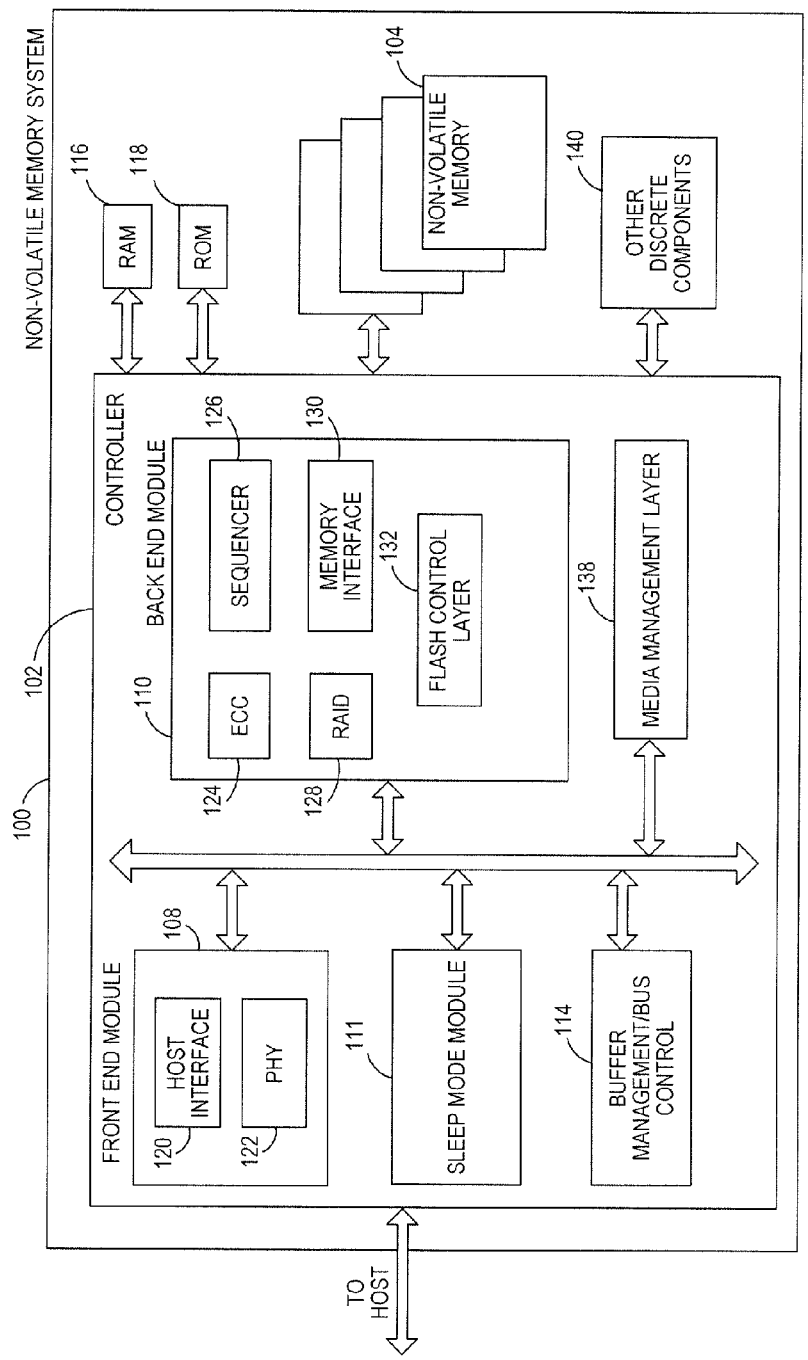
FIG. 2A is a block diagram illustrating exemplary components of the controller of the non-volatile memory system illustrated in FIG. 1A according to an embodiment.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. Modules of the controller 102 may include a sleep mode module 111 configured to instruct the ECC module 124 to generate parity bits upon entering sleep mode for data stored in volatile memory and use the parity bits to correct errors in that data when the memory system 100 exits sleep mode. These modules will be discussed in more detail below.

Referring again to modules of the controller 102, a buffer manager/bus controller 114 manages buffers in random access memory (RAM) 116 (volatile memory) and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, eMMC, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory 104. As will be explained in more detail below, the ECC module 124 can also be used to generate parity bits for data stored in volatile memory (e.g., RAM 116) when the memory system 100 enters sleep mode and use those parity bits to correct data in the volatile memory when the memory system 100 returns to active mode. In this way, the same ECC module 124 is used to secure volatile memory during sleep mode and secure non-volatile memory 104 during active mode.

A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. Of course, these embodiments can be used with other interfaces and should not be restricted to those that are listed here. A flash control layer 132 controls the overall operation of back end module 110.

Additional components of system 100 illustrated in FIG. 2A include media management layer 138, which performs wear leveling of memory cells of non-volatile memory die 104. System 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
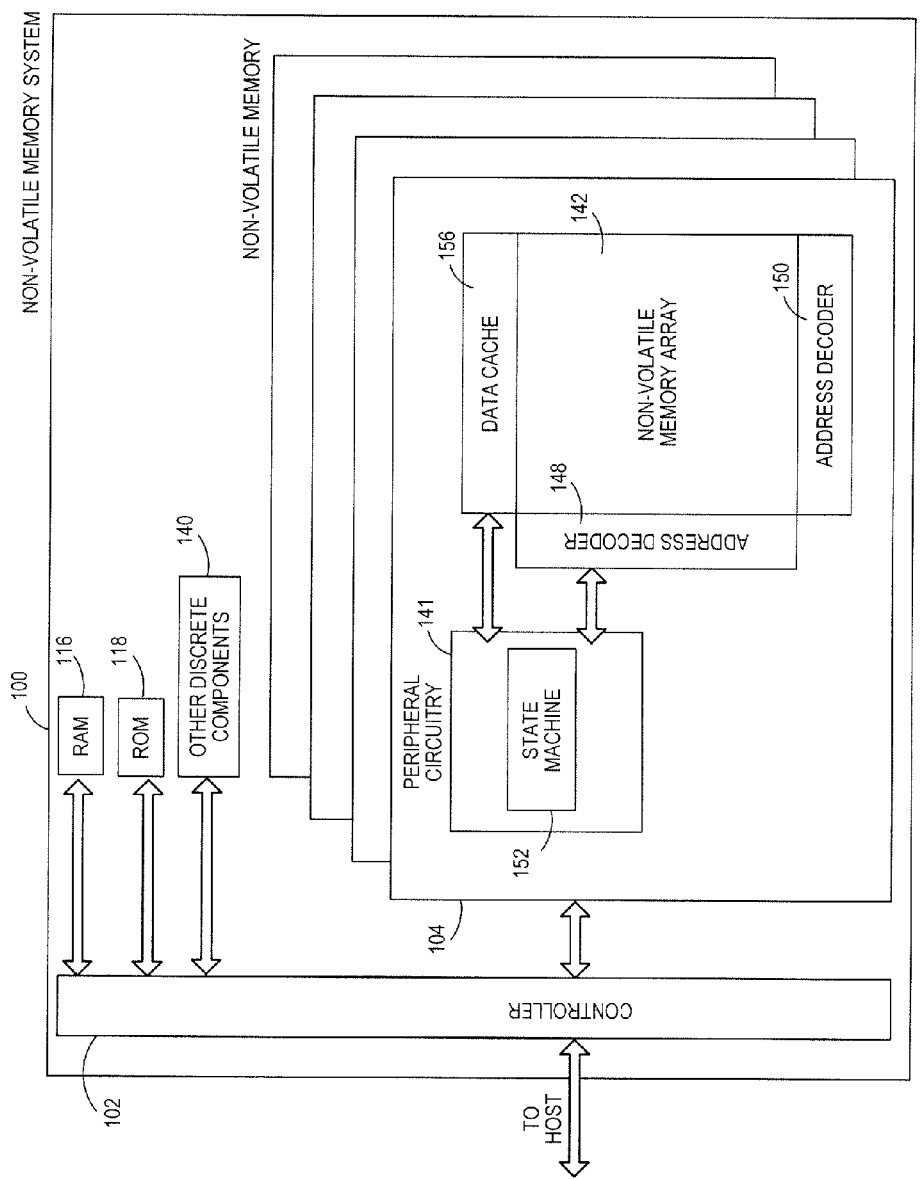
FIG. 2B is a block diagram illustrating exemplary components of the non-volatile memory of the non-volatile memory storage system illustrated in FIG. 1A according to an embodiment.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102. Non-volatile memory die 104 further includes a data cache 156 that caches data.

As mentioned above, the memory system 100 may be placed in sleep mode. As used herein, "sleep mode" refers to a mode of operation of the memory system 100 in which there is a reduction in the power supplied to the memory system 100 (during sleep mode/DPD, other modules are also being totally shut down (including unnecessary RAMs) in order to conserve power) (e.g., from a host, such as when the memory system 100 is embedded in the host). Sleep mode can be automatically entered (e.g., after an elapsed time with no user activity) or specifically requested by a user (e.g., by pressing a button on the host). In one embodiment, the reduction of power caused by sleep mode results in power being removed from some of the volatile memory components (e.g., some of the RAMs 116) in the memory system 100. For example, in sleep mode, power supplied to the volatile memory can be reduced to a predefined voltage level that is lower than in an active mode. "Active mode" refers to a mode of operation of the memory system 100 in which power is returned to the components that were affected by sleep mode. In one embodiment, active mode is the default operating mode of the memory system 100, and active mode can be returned to after sleep mode when the user interacts with the host, for example (e.g., providing some type of input).

If the memory system 100 is in sleep mode for a long period of time, the reduction in the power supply voltage to the volatile memory can cause bit flips (e.g., initially-stored 0s being read as 1s, or initially-stored 1s being read as 0s) at unpredictable locations in the volatile memory. These bit flips can be caused by alpha particle radiation and various circuit and process failures, such as weak cells, parasitic capacitances, cross couplings, and timing issues, for example. This can cause serious and unpredictable device failures. For example, program command bits may be erroneously flipped making the command unknown to the controller 102.

Figure 3:
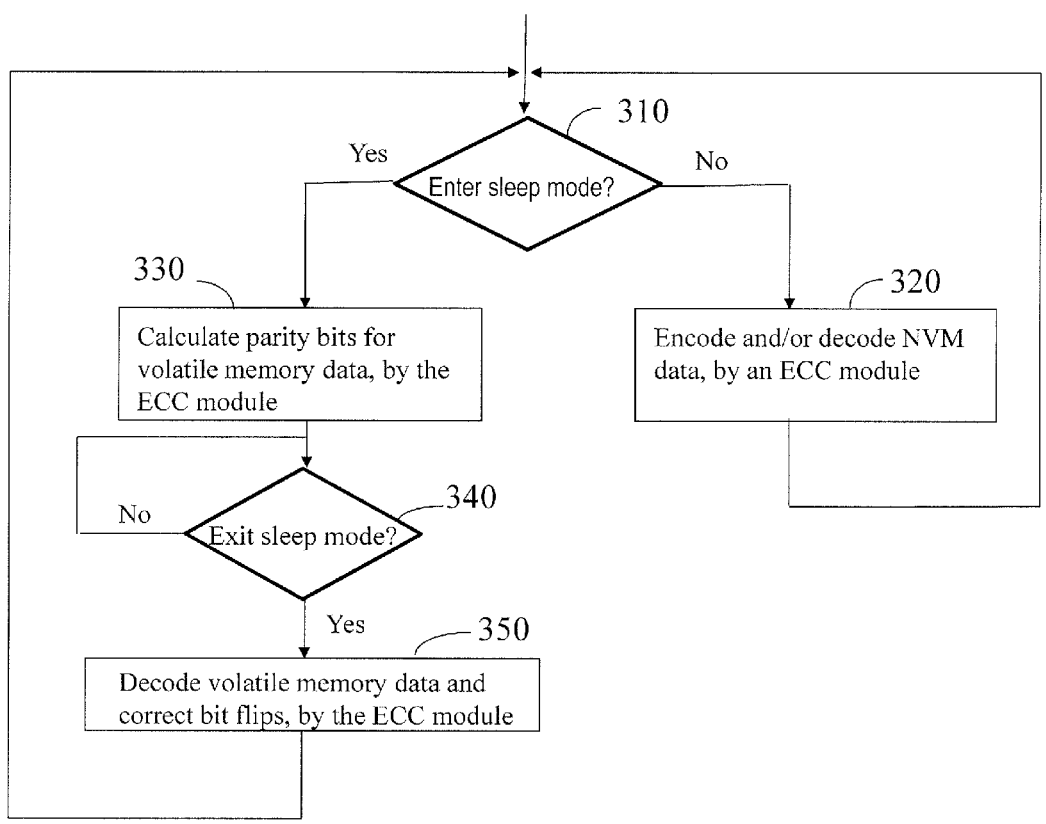
FIG. 3 is flowchart of a method of an embodiment for securing volatile memory during sleep mode using the same ECC module used to secure non-volatile memory during active mode.

The following embodiments can be used to address this situation. In one embodiment, a memory system and method are provided for securing volatile memory (e.g., RAM 116) during sleep mode using the same ECC module 124 (e.g., a low-density parity-check (LDPC) module) used to secure non-volatile memory 104 during active mode. ECC modules are typically designed to detect erroneous bits in non-volatile memory 104, which is inherently vulnerable and may lose charge from their floating gates. This embodiment recognizes that, during sleep mode, the ECC module 124 used to secure data in the non-volatile memory 104 is typically unused. So, this embodiment takes advantage of this "down time" by repurposing the ECC module 124 for use to secure data in the volatile memory. FIG. 3 is a flow chart illustrating this method.

As shown in FIG. 3, the memory system 100 (e.g., the controller 102, the sleep mode module 111, firmware, or another component in the memory system 100) determines if the memory system is entering sleep mode (act 310). If the memory system 100 is not entering sleep mode (i.e., the memory system 100 is in active mode), the memory system 100 uses the ECC module 124 to secure the data in the non-volatile memory 104 by encoding data written to the non-volatile memory 104 and decoding data read from the non-volatile memory (act 320) and correcting detected erroneous bits. However, if the memory system 100 is entering sleep mode, the memory system 100 uses the ECC module 124 to calculate parity bits for the data stored in the volatile memory (e.g., RAM and Data Communication Channel Multiplex (DCCM) control data) and store the parity bits in the volatile memory (act 330). The memory system 100 then monitors for when the memory system 100 exits the sleep mode and resumes active mode (act 340). When the memory system 100 exits the sleep mode, the memory system 100 decodes the data stored in the volatile memory (using the previously-generated and stored parity bits) to determine if any errors are in the data and correct any such errors (e.g., by "flipping bits") (act 350). In this way, the ECC module 124 calculates parity bits for volatile memory data upon entering sleep mode and, upon exiting sleep mode, decodes the volatile memory data to verify that no bit flip(s) occurred during sleep mode. If bit flip(s) did occur, the ECC module 124 can correct the errors using the calculated parity bits.

As can be seen by this example, a single ECC module 124 can be used to secure data both in non-volatile memory 104 (during active mode) and in volatile memory (when entering and exiting sleep mode). There are several advantages associated with these embodiments. For example, because the ECC module 124 would not normally be used in sleep mode, this embodiment uses this otherwise-underutilized module to encode and decode volatile memory data, while leaving the ECC module 124 free to secure the non-volatile memory 104 when the memory system 100 is active. As such, there are no "collisions" of requests to use the ECC module 124 by the sleep and active modes. Another advantage is that, because the number of bit flips that may need to be corrected at each wake up are relatively small (waking up from sleep mode typically occurs more than 1,000 times per day), the ECC module 124 can be expected to correct and secure the volatile memory data. This improves reliability and user experience by providing a bit-flip countermeasure. Also, in one embodiment, only firmware changes (and no hardware changes) are used. This allows this method to be used in existing memory system with a firmware update.

There are several alternatives that can be used. For example, in one of the above embodiments, the memory system 100 we encoded volatile memory data and stored parity bits in volatile memory, so decoding and error correction will be possible when exiting from sleep mode. In an alternate embodiment, a similar mechanism is used; however, the ECC (e.g., LDPC) module is used for storing only the CRC calculated on the volatile memory data. This way, the memory system reduces the amount of space needed in extra RAM. However, with this approach, it may be possible only to detect if a bit-flip occurred when exiting sleep mode without being able to correct the error. When a bit flip is detected, the memory system can be reset by firmware to prevent a possible failure. The penalty here is that the host loses synchronization to the memory system and may need to resync to the memory system again, meaning performance penalty is possible if bit flip is detected. So, in an alternate embodiment, two options may be supported. In one option, the memory system can detect errors and correct them without performance penalty (as described herein above). In the second option, the memory system can detect and prevent possible failure by a reset with some penalty.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A memory system comprising:
   a volatile memory;
   a non-volatile memory; and
   an error correction code (ECC) module in communication with the volatile memory and the non-volatile memory, wherein the ECC module is configured to encode, decode, and correct data stored in the volatile memory when the memory system enters and exits a sleep mode and is further configured to encode, decode, and correct data stored in the non-volatile memory when the memory system is in active mode, wherein the ECC module is selectable between the volatile memory and the non-volatile memory based on whether the memory system is entering or exiting sleep mode or is in active mode.

2. The memory system of claim 1, wherein the ECC module comprising a low-density parity-check (LDPC) code module.

3. The memory system of claim 1, wherein the ECC module is configured to calculate parity bits for the data stored in the volatile memory and store the parity bits in the volatile memory upon entering sleep mode.

4. The memory system of claim 1, wherein the ECC module is configured to decode the data stored in the volatile memory upon exiting sleep mode and correct detected error(s).

5. The memory system of claim 1, wherein, when the memory system is in sleep mode, a power supply to the volatile memory is reduced to a predefined voltage level that is lower than a level used when the memory system is in active mode.

6. The memory system of claim 1, wherein the non-volatile memory is a three-dimensional memory.

7. The memory system of claim 1, wherein the memory system is embedded in a host.

8. The memory system of claim 1, wherein the memory system is removably connected to a host.

9. A method for securing volatile memory during sleep mode, the method comprising:
   performing the following in a memory system comprising a volatile memory, a non-volatile memory, and an error correction code (ECC) module:
      determining if the memory system is in active mode or in a sleep mode;
      in response to determining that the memory system is in active mode, using the ECC module to encode, decode, and correct data stored in the non-volatile memory; and
      in response to determining that the memory system is in sleep mode, using the ECC module to encode, decode, and correct data stored in the volatile memory data;
   wherein the ECC module is selectable between the volatile memory and the non-volatile memory based on whether the memory system is entering or exiting sleep mode or is in active mode.

10. The method of claim 9, wherein in response to determining that the memory system is in sleep mode, the ECC module is used to:
    calculate parity bits for the data stored in the volatile memory; and
    store the calculated parity bits in the volatile memory.

11. The method of claim 9 further comprising in response to exiting sleep mode, decoding the data stored in the volatile memory and correcting erroneous flipped bits, if detected.

12. The method of claim 9 further comprising reducing a power supply to the volatile memory to a predefined voltage level upon entering sleep mode, wherein the predefined voltage level is lower than a voltage level that the power supply is set at in active mode.

13. The method of claim 9, wherein the ECC module comprising a low-density parity-check (LDPC) code module.

14. The method of claim 9 further comprising calculating parity bits for the data stored in the volatile memory and storing resulting code words and parity bits in the volatile memory upon entering sleep mode.

15. The method of claim 9, wherein the non-volatile memory is a three-dimensional memory.

16. The method of claim 9, wherein the memory system is embedded in a host.

17. The method of claim 9, wherein the memory system is removably connected to a host.

18. A mobile system comprising:
    a host configured to operate in a plurality of modes; and
    an embedded storage device comprising:
       a volatile memory;
       a non-volatile memory;

a processor; and an error correction code (ECC) module configured to correct errors in the embedded storage device, wherein the processor is configured to manage the ECC module to encode volatile memory data upon entering sleep mode, and to decode and correct volatile data upon exiting sleep mode, thereby securing the volatile memory data in sleep mode, and wherein the processor is configured to manage the ECC module to encode, decode and correct non-volatile memory data thereby securing the non-volatile memory data in other modes;

wherein the ECC module is selectable between the volatile memory and the non-volatile memory based on whether the memory system is entering or exiting sleep mode or is in one of the other modes.

19. The mobile system of claim 18, wherein the non-volatile memory is a three-dimensional memory.

20. The mobile system of claim 18, wherein the sleep mode is entered in response to receiving an indication for entering sleep mode from the host.

21. The mobile system of claim 18, wherein the sleep mode is entered in response to a pre-defined period of time expiring without a host operation.

22. The memory system of claim 1 further comprising a controller in communication with the ECC module, wherein the controller is configured dedicate the ECC module to the volatile memory during sleep mode and is further configured to dedicate the ECC module to the non-volatile memory during active mode, wherein the ECC module is configured to be used with both the volatile memory and the non-volatile memory but not at the same time.

23. The memory system of claim 22, wherein the controller is further configured to avoid colliding requests to the ECC module by only allowing requests related to the volatile memory during sleep mode and only allowing requests related to the non-volatile memory during active mode.

24. The memory system of claim 1, wherein the ECC module is time-division multiplexed between the volatile memory and the non-volatile memory.

25. The method of claim 9 further comprising dedicating the ECC module to the volatile memory during sleep mode and dedicating the ECC module to the non-volatile memory during active mode, wherein the ECC module is configured to be used with both the volatile memory and the non-volatile memory but not at the same time.

26. The method of claim 9 further comprising avoiding colliding requests to the ECC module by only allowing requests related to the volatile memory during sleep mode and only allowing requests related to the non-volatile memory during active mode.

27. The method of claim 9, wherein the ECC module is time-division multiplexed between the volatile memory and the non-volatile memory.

28. The mobile system of claim 18, wherein the processor is further configured to dedicate the ECC module to the volatile memory during sleep mode and to dedicate the ECC module to the non-volatile memory during one of the other modes, wherein the ECC module is configured to be used with both the volatile memory and the non-volatile memory but not at the same time.

29. The mobile system of claim 18, wherein the processor is further configured to avoid colliding request to the ECC module by only allowing requests related to the volatile memory during sleep mode and only allowing requests related to the non-volatile memory during one of the other modes.

30. The mobile system of claim 18, wherein the ECC module is time-division multiplexed between the volatile memory and the non-volatile memory.

* * * * *